(12) United States Patent
Iwancizko et al.

(10) Patent No.: US 6,251,183 B1
(45) Date of Patent: Jun. 26, 2001

(54) RAPID LOW-TEMPERATURE EPITAXIAL GROWTH USING A HOT-ELEMENT ASSISTED CHEMICAL VAPOR DEPOSITION PROCESS

(75) Inventors: Eugene Iwancizko, Lafayette; Kim M. Jones, Arvada; Richard S. Crandall, Boulder; Brent P. Nelson; Archie Harvin Mahan, both of Golden, all of CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 09/316,342

(22) Filed: May 21, 1999

Related U.S. Application Data

(60) Provisional application No. 60/086,299, filed on May 21, 1998.

(51) Int. Cl.⁷ .................................................. C30B 25/14
(52) U.S. Cl. .................. 117/88; 117/8; 117/93; 117/94; 117/95
(58) Field of Search .................................. 117/8, 88, 93, 117/94, 95; 438/925, 935, 508

(56) References Cited

U.S. PATENT DOCUMENTS

| | | | |
|---|---|---|---|
| 5,221,412 | * | 6/1993 | Kagata et al. .......................... 117/94 |
| 5,298,452 | * | 3/1994 | Meyerson ............................... 438/508 |
| 5,397,737 | * | 3/1995 | Mahan et al. .......................... 438/925 |
| 5,495,823 | * | 3/1996 | Kobayashi ................................ 117/8 |
| 5,634,973 | * | 6/1997 | Cabral, Jr. et al. ..................... 117/95 |

* cited by examiner

Primary Examiner—Felisa Hiteshew
(74) Attorney, Agent, or Firm—Paul J. White

(57) ABSTRACT

The invention provides a process for depositing an epitaxial layer on a crystalline substrate, comprising the steps of providing a chamber having an element capable of heating, introducing the substrate into the chamber, heating the element at a temperature sufficient to decompose a source gas, passing the source gas in contact with the element; and forming an epitaxial layer on the substrate.

10 Claims, 3 Drawing Sheets

RAPID LOW-TEMPERATURE EPITAXIAL GROWTH USING A HOT-ELEMENT ASSISTED CHEMICAL VAPOR DEPOSITION PROCESS

CROSS REFERENCE TO RELATED APPLICATIONS

This 35 U.S.C. 111(a) application is filed pursuant to 35 U.S.C. 119(e)(1) for an invention disclosed in U.S. Provisional Application No. 60/086,299 entitled: RAPID, LOW-TEMPERATURE EPITAXIAL GROWTH USING A HOT-ELEMENT ASSISTED CHEMICAL VAPOR DEPOSITION PROCESS, filed May 21, 1998.

CONTRACTUAL ORIGIN OF THE INVENTION

The United States Government has rights in this invention pursuant to Contract No. DE-AC36-98GO10337 between the United States Department of Energy and the Midwest Research Institute.

BACKGROUND OF THE INVENTION

1. Field of the Invention

This invention relates to a hot-element chemical vapor deposition process to grow epitaxial films on a substrate.

2. Description of the Prior Art

Methods for the deposition of an epitaxial silicon film, for use in technical applications, have typically been performed at high temperatures. Conventional deposition temperatures usually exceed 1,000° C., or involve a preparatory high temperature cycle in order to clean a single crystalline substrate prior to the deposition of an epitaxial silicon layer. For example in Kagata, U.S. Pat. No. 5,221,412, a method is disclosed which provides for the vapor phase epitaxial growth of a silicon film on a single crystal substrate using diluted disilane, wherein the process is carried out at a temperature of approximately 1,000° C. This operating temperature serves to both clean the substrate and thermally decompose the source gas. At these high temperatures dopants in the substrate, upon which the epitaxial layer is deposited, often diffuse from the substrate into the epitaxial layer during evaporation and deposition from the gas phase. As a result, the thickness of the epitaxial layer must be greater than the diffusion migration distance of the dopants from the substrate. These dopant diffusion dynamics thus dictate the ultimate thickness of the desired epitaxial thin-layer because the layer cannot be thinner than the diffusion migration distance. Because thin-epitaxial-layers are useful in order to reduce the overall dimensions of high-performance integrated circuitry, it is desirable to develop a low-temperature method to rapidly grow epitaxial silicon. In addition, a rapid low temperature method to make thin-film epitaxial silicon would reduce manufacturing costs.

The prior art has disclosed several methods for the production of epitaxial films with efforts directed toward reducing the substrate temperature during the evaporation phase. For example Kobayashi, U.S. Pat. No. 5,495,823, has disclosed a method in which a single crystalline thin-film is formed on a semiconductor substrate at temperatures not higher than 800° C. In this method, as the process temperature is slowly increased from approximately 350° C. to 620° C., silane gas is carried onto a single crystalline silicon substrate to form an amorphous silicon thin-film. At the same-time the amorphous silicon thin-film slowly begins to single crystallize. When the temperature reaches 540° C. the growth rate of the single crystalline silicon film exceeds that of the amorphous silicon film. The single crystal silicon thin film is finally formed at 620° Centigrade.

Another method, used to grow epitaxial films at lower processing temperatures, is disclosed in U.S. Pat. No. 5,298,452, issued to Meyerson. There, a method and apparatus for depositing single crystal, epitaxial films of silicon on a plurality of substrates in a hot wall, isothermal deposition system is described. The deposition temperatures are less than 800° C., and the operating pressures during deposition are such that non-equilibrium growth kinetics determine the deposition of the silicon films. An isothermal bath gas of silicon is produced allowing uniform deposition of epitaxial silicon films simultaneously on multiple substrates. This is a flow system in which means are provided for establishing an ultrahigh vacuum in the range of about $10^{-9}$ Torr prior to epitaxial deposition. While the Kobayashi and Meyerson methods are carried out at comparatively lower temperatures, the Kobayashi method provides a slow indirect method, and the Meyerson method is carried at an ultrahigh pressure.

The National Renewable Energy Laboratory has pioneered the use of a direct low-pressure hot-element assisted chemical vapor deposition process for growing a semiconducting grade α-Si:H from the decomposition products of silane. See. e.g. R. S. Crandall, et. al., Sol. Cells 30, 15 (1991); A. H. Mahan, et. al., J. Appl.Phys., 69, 6728 (1991). Moreover, in Mahan, U.S. Pat No. 5,397,737, a similar hot-element deposition apparatus has been used to generate a low-hydrogen-content high quality hydrogenated amorphous silicon film by passing a stream of silane gas over a high temperature tungsten element. The Mahan disclosure is incorporated herein by reference. However, while the Mahan process uses a hot-element chemical vapor deposition reactor to form amorphous silicon below 400° C., this invention provides a new and significantly different use of the hot-element apparatus to rapidly grow an epitaxial layer, such as silicon, at low substrate tempperatures.

SUMMARY OF THE INVENTION

In view of the foregoing it is a general object of the present invention to provide a low temperature process to grow an epitaxial layer on a substrate.

Another object of the invention is to provide a rapid, low pressure, and low temperature hot-element assisted chemical vapor deposition process to grow epitaxial silicon or germanium on a single crystalline substrate.

The foregoing specific objects and advantages of the invention are illustrative of those which can be achieved by the present invention and are not intended to be exhaustive or limiting of the possible advantages which can be realized. Thus, those and other objects and advantages of the invention will be apparent from the description herein or can be learned from practicing the invention, both as embodied herein or as modified in view of any variations which may be apparent to those skilled in the art.

Briefly, the invention provides a process for depositing an epitaxial layer on a crystalline substrate, comprising the steps of providing a chamber having an element capable of heating, introducing the substrate into the chamber, heating the element at a temperature sufficient to decompose a source gas, passing the source gas in contact with the element; and forming an epitaxial layer on the substrate.

DESCRIPTION OF THE PREFERRED EMBODIMENTS

Unless specifically defined otherwise, all technical or scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

The term "silane" means a gas species comprising the elements silicon and hydrogen. The term "germain" means a gas species comprising the elements germanium and hydrogen. The term "methane" means a gas species comprising the elements carbon and hydrogen. The terms "epitaxial layer" and/or "epitaxial film" mean a crystal which replicates a crystalline substrate. The term "source gas" means that gas which decomposes on the hot-element.

The low temperature epitaxial film may be produced according to the method of this invention using any suitable chemical vapor deposition hot-element apparatus, as will be understood readily by persons skilled in the art upon gaining an understanding of the features of this invention. However, to facilitate the explanation of this invention, a suitable apparatus is illustrated in FIGS. 1 and 2, wherein like numerals refer to like features.

Figure 1:
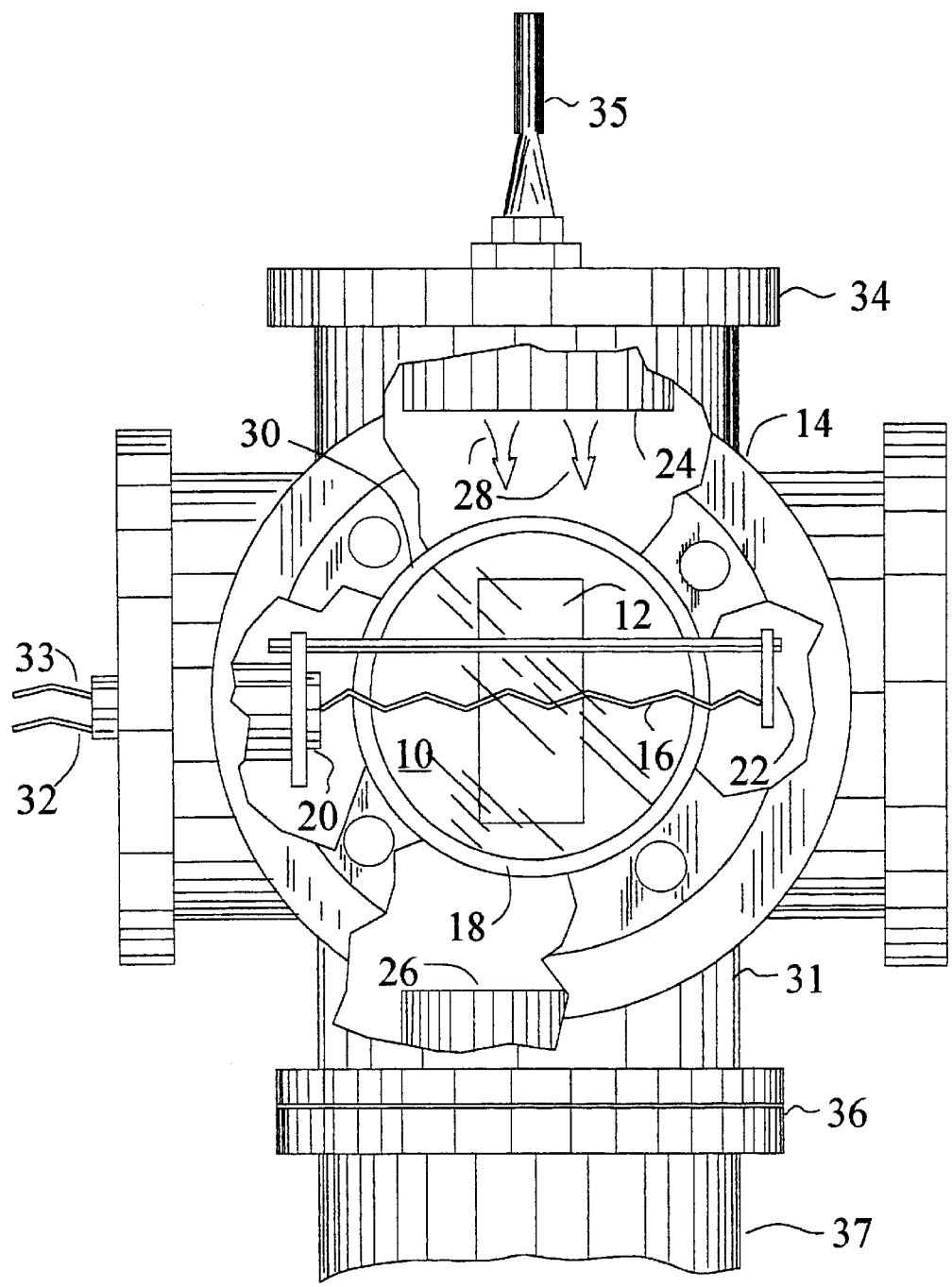
FIG. 1, is a top plan view of a suitable hot-element deposition chamber for growing an epitaxial film.

Referring now to the drawing figures, in FIG. 1 a top plan view of a suitable apparatus for carrying out the method of the invention is shown. Hot-element chemical vapor deposition chamber 10 is enclosed by housing 14. Housing 14 includes a transparent window 30 mounted in a top-flange opening 31. In the Figure, portions of the housing 14 are broken away to show the operative components of the chamber 10. Substrate table or holder 18 is positioned in the chamber 10 so as to support a single crystalline substrate 12 on which the epitaxial layer is to be deposited. A source-gas inlet 24 is mounted in a flange 34 and is connected by a conduit 35 to a feed-gas source. An outlet port 26 is mounted in flange 36 which is connected by conduit 37 to a vacuum pump (not shown). Vacuum pressure is controlled by a throttle valve (not shown), which is preferably disposed inline between conduit 37 and the vacuum pump in order to control the chamber 10 pressure throughout the deposition process. Wire leads 32, 33 are used to provide electric power to the electrodes 20, 22.

Figure 2:
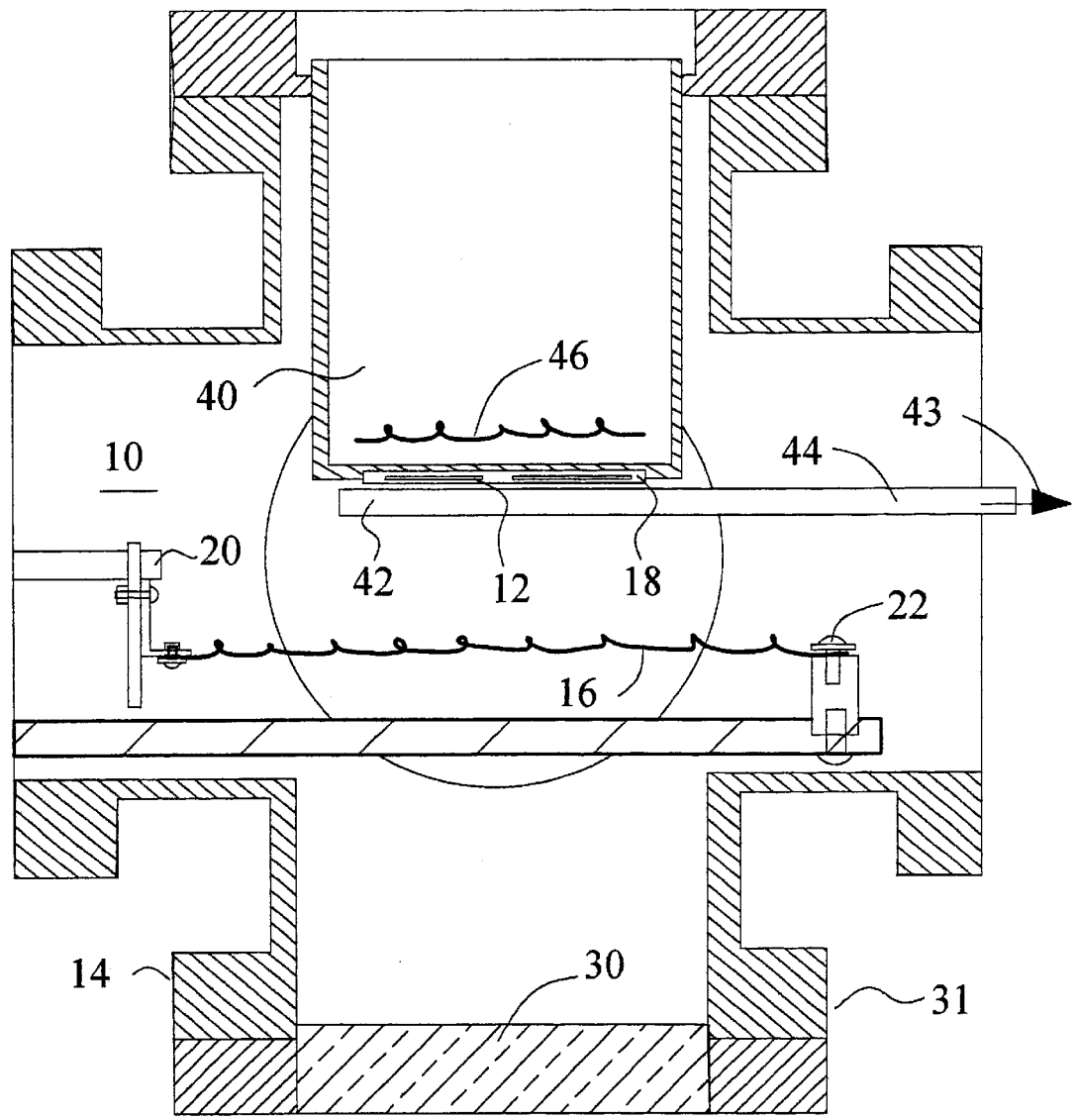
FIG. 2, is a frontal cross-section of the hot-element deposition chamber showing location of the element, shutter, and substrate heater.

Referring now to FIG. 2, heating element 46 is disposed in a heater can 40 outside the vacuum system and adjacent to the substrate table 18. The heating element 46 is used to heat the substrate 12 to a desired temperature, in the range of 150–500° C., preferably about 260° C. Hot-element 16, such as a tungsten wire, mesh, plate, or bar is supported between two electrodes 20, 22 over the substrate holder 18. Disposed between the substrate table 18 and the hot-wire element 16 is a movable shutter 42, positioned in chamber 10, to provide an automatic or manual means for control of the element 16 source-gas vapor decomposition products during growth of the epitaxial film onto the substrate 12. Shutter handle 44 is used to slide shutter 42 from the closed position, as shown in the Figure, outwardly as indicated by arrow 43, into an open position.

Referring again to FIG. 2, deposition of an epitaxial layer proceeds by first placing the substrate 12 on the support table 18 within the chamber 10. Chamber 10 is then sealed. Substrate 12 is preferably disposed 4–6 cm away from the element 16. The vacuum pump is started and the chamber 10 is evacuated to a pressure of $10^{-6}$ Torr or less. The substrate heating element 46 is powered-up to heat the substrate 12 to a temperature in the range of 150°–500° C. for approximately one hour. As shown in FIG. 1, the source-gas 28 is allowed to bleed into chamber 10 through tube 35 and inlet 24. The source-gas 28, such as silane, methane and silane, or germanium, may include a dopant, which is useful in the formation of doped epitaxial layers. The chamber pressure is adjusted, using a throttling valve, such that a chamber pressure is established in the range of 1–1,000 mTorr. The source-gas 28 preferably flows, within the chamber, 10 transverse to the element 16. Electric power is applied to the element 16 causing element 16 to reach a temperature in the range of 1,400°–2,200° C. At this temperature, the source-gas 28 is readily absorbed onto the hot element 16, where it is decomposed substantially in the form of its simple atomic species, such as silicon and hydrogen. The atomic species are evaporated onto the substrate 12 to grow an epitaxial thin-film on the substrate 12.

EXPERIMENT

In this experiment the growth of epitaxial silicon is described as an example of the method of the present invention. The surface of a single-crystal substrate was first prepared for an over-layer of epitaxial silicon. Substrate preparation included an initial cleaning of the surface with a series of electronic grade solutions, acetone, methanol, and then isopropyl alcohol. The cleaned surface was rinsed in deionized water and the rinsed substrate was cleaned in a 2% hydrofluoric acid deionized water solution for three seconds. The substrate was rinsed again in deionized water followed by isopropyl alcohol. The substrate was not allowed to dry between the cleaning and rinsing steps. A stream of dry-nitrogen was then directed at the substrate in order to air it clean and dry. The substrate was loaded onto the substrate holder, the substrate and holder were introduced into the chamber, and the chamber was vacuum sealed with the shutter in its closed position (as shown 42, in FIG. 2) to isolate the substrate from the element. The chamber was then evacuated to a pressure of $10^{-6}$ Torr, and the substrate heated to a temperature of 260° C. for one hour. The wire-element was then powered-up to fourteen amps (9.13 volts ac).

The element temperature at which the decomposition of the silicohydride gas begins will vary somewhat, depending on the specific silicohydride gas used, such as, for example silane, disilane or other gases or a combination of gases containing silicon and hydrogen. The preferred gas is silane ($SiH_4$), for which the element temperature should be at least 1,400° C., and preferably 1,950° C. This temperature provided the most efficient and effective decomposition of silane gas into its silicon and hydrogen decomposition elements. In this experiment, silane was introduced into the chamber at a flow rate of 20 standard cubic centimeters per minute (sccm). The flow rate was regulated by a flow controller. A throttling valve, located between the chamber and a turbo-molecular pump, was adjusted to maintain the chamber pressure at 10 mTorr. Once the system had achieved the above steady state conditions, within one minute of the introduction of silane, the shutter handle was moved outwardly into the open position. Opening the shutter started the deposition of the silicon and hydrogen decomposition species onto the substrate. After fifteen seconds, the shutter was moved back into its closed position which ending the rapid low-temperature epitaxial silicon deposition step.

Figure 3:
FIG. 3, is a cross-section high resolution transmission electron micrograph showing a silicon crystal substrate, a 10 nm thick layer of epitaxial silicon, and an over-layer of α-Si:H.

Referring now to FIG. 3, it is shown a high resolution transmission electron micrograph of a cross-section of the epitaxial silicon layer 52 deposited on the single crystal substrate 50 according to the above example. In the Figure, once the epitaxial silicon layer 52 had been formed on the substrate 50, the flow of silane gas was shut off, and the substrate was reheated to 400° C., using the substrate heated, in order to deposit an additional layer of amorphous silicon 54. The sample was removed from the chamber after thirty minutes. The substrate 50 is a single crystalline silicon having a 10 nm thick epitaxial over-layer 52 grown according to the method of the invention. The amorphous silicon layer 54 is also shown. The epitaxial layer 52 was rapidly formed at approximately 8 angstroms/sec.

While the present invention has been illustrated and described with reference to particular structures and methods of fabrication, it will be apparent that other changes and modifications can be made therein with the scope of the present invention as defined by the appended claims.

We claim:

1. A process for depositing an epitaxial layer on a crystalline substrate, comprising the steps of:
   (a) providing a chamber having an element capable of heating;
   (b) introducing the substrate into the chamber;
   (c) heating the element at a temperature in the range of 1,400°–2,200° C.;
   (d) passing the source gas in contact with the element; and
   (e) forming an epitaxial layer on the substrate.

2. A process for depositing an epitaxial layer on a crystalline substrate, comprising the steps of:
   (a) providing a chamber having an element capable of heating;
   (b) introducing the substrate into the chamber;
   (c) heating the substrate;
   (d) heating the element at a temperature in the range of 1,400°–2,200° C.;
   (e) passing the source gas in contact with the element; and
   (f) forming an epitaxial layer on the substrate.

3. A process for depositing an epitaxial layer on a crystalline substrate, comprising the steps of:
   (a) providing a chamber having an element capable of heating;
   (b) introducing the substrate into the chamber;
   (c) heating the element at a temperature in the range of 1,400°–2,200° C.;
   (d) passing the source gas in contact with the element; and
   (e) forming an epitaxial layer on the substrate, wherein the source gas comprises silane and the layer comprises epitaxial silicon.

4. A process for depositing an epitaxial layer on a crystalline substrate, comprising the steps of:
   (a) providing a chamber having an element capable of heating;
   (b) introducing the substrate into the chamber;
   (c) heating the element at a temperature in the range of 1,400°–2,200° C.;
   (d) passing the source gas in contact with the element; and
   (e) forming an epitaxial layer on the substrate, wherein the source gas comprises germane and the layer comprises epitaxial germanium.

5. A process for depositing an epitaxial layer on a crystalline substrate, comprising the steps of:
   (a) providing a chamber having an element capable of heating;
   (b) introducing the substrate into the chamber;
   (c) heating the element at a temperature in the range of 1,400°–2,200° C.;
   (d) passing the source gas in contact with the element; and
   (e) forming an epitaxial layer on the substrate, wherein the source gas comprises a mixture of silane and methane and the layer comprises epitaxial silicon carbide.

6. A process for depositing an epitaxial layer on a crystalline substrate, comprising the steps of:
   (a) providing a chamber having an element capable of heating;
   (b) introducing the substrate into the chamber;
   (c) heating the element at a temperature in the range of 1,400°–2,200° C.;
   (d) passing the source gas in contact with the element; and
   (e) forming an epitaxial layer on the substrate, wherein the source gas comprises a mixture of silane and germane and the layer comprises an epitaxial silicon germanium alloy.

7. A process for depositing an epitaxial layer on a crystalline substrate, comprising the steps of:
   (a) providing a chamber having an element capable of heating;
   (b) introducing the substrate into the chamber;
   (c) heating the element at a temperature in the range of 1,400°–2,200° C.;
   (d) passing the source gas in contact with the element; and
   (e) forming an epitaxial layer on the substrate, wherein the source gas further comprises a dopant.

8. A process for depositing an epitaxial layer on a crystalline substrate, comprising the steps of:
   (a) providing a chamber having an element capable of heating;
   (b) introducing the substrate into the chamber;
   (c) heating the element at a temperature in the range of 1,400°–2,200° C.;
   (d) passing the source gas in contact with the element; and
   (e) forming an epitaxial layer on the substrate, wherein passing the source gas comprises a partial pressure in a range of 1–10,000 mTorr.

9. A process for depositing an epitaxial layer on a crystalline substrate, comprising the steps of:
   (a) providing a chamber having an element capable of heating;
   (b) introducing the substrate into the chamber;
   (c) heating the substrate to a temperature less than 600° C.;
   (d) heating the element at a temperature in the range of 1,400°–2,200° C.;
   (e) passing the source gas in contact with the element; and
   (f) forming an epitaxial layer on the substrate.

10. A process for depositing an epitaxial layer on a crystalline substrate, comprising the steps of:
    (a) providing a chamber having an element capable of heating;
    (b) introducing the substrate into the chamber;
    (c) heating the substrate to a temperature in the range of 150°–400° C.;
    (d) heating the element at a temperature in the range of 1,400°–2,200° C.;
    (e) passing the source gas in contact with the element; and
    (f) forming an epitaxial layer on the substrate.

* * * * *